(12) United States Patent
Fukunaga

(10) Patent No.: US 9,054,001 B2
(45) Date of Patent: Jun. 9, 2015

(54) IMAGING DEVICE

(71) Applicant: OLYMPUS CORPORATION, Tokyo (JP)

(72) Inventor: Yasuhiro Fukunaga, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 120 days.

(21) Appl. No.: 14/027,854

(22) Filed: Sep. 16, 2013

(65) Prior Publication Data

US 2014/0084404 A1  Mar. 27, 2014

(30) Foreign Application Priority Data

Sep. 21, 2012 (JP) .................................. 2012-208597

(51) Int. Cl.
*H01L 27/146* (2006.01)
*H01L 21/00* (2006.01)

(52) U.S. Cl.
CPC .... *H01L 27/14625* (2013.01); *H01L 27/14621* (2013.01); *H01L 27/14643* (2013.01)

(58) Field of Classification Search
CPC .................... H01L 27/14645; H01L 27/14621
USPC ................................ 257/432, 444; 438/70, 82
See application file for complete search history.

(56) References Cited

FOREIGN PATENT DOCUMENTS

| JP | 3781927 B2 | 6/2006 |
| JP | 2001134755 * | 6/2006 ................ G06T 5/00 |
| JP | WO2009/072177 A1 | 6/2009 |

OTHER PUBLICATIONS

Tack Nicolaas et al., "A Compact, High-speed and Low-cost Hyperspectral Imager", SPIE, 2012, Cited in Specification.

* cited by examiner

*Primary Examiner* — Calvin Lee
(74) *Attorney, Agent, or Firm* — Westerman, Hattori, Daniels & Adrian, LLP

(57) ABSTRACT

An imaging device includes: an R pixel that is made of an organic material and includes a photodiode on which an organic film color filter that transmits red light is formed; a G pixel that is made of an organic material and includes a photodiode on which an organic film color filter that transmits green light is formed; a B pixel that is made of an organic material and includes a photodiode on which an organic film color filter that transmits blue light is formed; and an FPF pixel including a photodiode on which a Fabry-Perot filter in which an intermediate layer interposed between dielectric layers is made of a material that transmits light is formed. The R pixel, the G pixel, the B pixel, and the FPF pixel are periodically arranged.

6 Claims, 5 Drawing Sheets

IMAGING DEVICE

BACKGROUND OF THE INVENTION

1. Field of the Invention

The present invention relates to an imaging device.

Priority is claimed on Japanese Patent Application No. 2012-208597, filed Sep. 21, 2012, the contents of which are incorporated herein by reference.

2. Description of Related Art

In recent years, as a method of diagnosing cancer, a method using a fluorescent pigment which is typified by indocyanine green (ICG) has been actively studied. A technique is known which forms a filter using Fabry-Perot interference on an image sensor using a general CMOS process to manufacture an optical element for detecting light with a specific wavelength, such as fluorescence (for example, see Non-patent Document: "Nicolaas Tack, three others, A Compact, High-speed and Low-cost Hyperspectral Imager, SPIE, 2012"). Hereinafter, a pixel in which a Fabry-Perot filter is formed on a photodiode is referred to as a Fabry-Perot filter pixel (FPF pixel).

In addition, a technique is known which applies the Fabry-Perot filter to an endoscope to capture a fluorescent image, thereby separately capturing the image of a cancer tissue part using a fluorescent pigment (for example, see PCT International Publication No. WO2009/072177). Furthermore, a technique is known which generates an RGB image that is generally captured by an imaging device, such as a digital camera, from a fluorescent image to capture a visible image sensed by the human eye (for example, see Japanese Patent No. 3781927).

The technique disclosed in Non-patent Document: "Nicolaas Tack, three others, A Compact, High-speed and Low-cost Hyperspectral Imager, SPIE, 2012" will be described with reference to FIGS. 6 and 7. FIG. 6 is a schematic diagram illustrating an example of an FPF pixel according to the related art in which a Fabry-Perot filter is formed on a pixel of a CMOS image sensor. In the example shown in FIG. 6, a plurality of pixels F1 to F8 are formed on a semiconductor substrate 5-5. A photodiode (PD) 5-4 is formed in each of the pixels F1 to F8. In addition, dielectric layers 5-1 and 5-3 and an interlayer film 5-2 are formed, as the Fabry-Perot filter, on a light-receiving surface of each of the pixels F1 to F8. The interlayer film 5-2 which is formed above each of the pixels F1 to F8 is interposed between the dielectric layers 5-1 and 5-3. The thicknesses of the interlayer films 5-2 formed above the pixels F1 to F8 are different from each other such that light components in different wavelength bands are incident on the photodiodes 5-4 provided in the pixels F1 to F8. According to this structure, the pixels F1 to F8 can detect, for example, light in a narrow transmission band, as shown in FIG. 7.

FIG. 7 is a graph illustrating the wavelength of light passing through the Fabry-Perot filter according to the related art. In the graph shown in FIG. 7, the horizontal axis is a wavelength and the vertical axis is transmittance. In the example shown in FIG. 7, the Fabry-Perot filter (the dielectric layers 5-1 and 5-3 and the interlayer film 5-2) formed on the pixel F1 transmits light with a narrow band wavelength of about 420. Therefore, the pixel F1 can detect light with a narrow band wavelength of about 420 nm. Similarly to the pixel F1, the pixels F2 to F8 can detect light with a narrow band wavelength, depending on light with wavelengths transmitted through the farmed dielectric layers 5-1 and 5-3 and the farmed interlayer film 5-2. The band of light transmitted through the dielectric layers 5-1 and 5-3 and the interlayer film 5-2 formed on each of the pixels F2 to F8 is as shown in FIG. 7.

A fluorescent image can be captured by the pixels F1 to F8 shown in FIG. 6 and an RGB image can be generated based on the fluorescent image, as described in the related art. For example, in the technique disclosed in Japanese Patent No. 3781927, the spectral characteristics of blue light are generated based on the values detected by the pixels F1 to F3, the spectral characteristics of green light are generated based on the values detected by the pixels F4 and F5, and the spectral characteristics of red light are generated based on the values detected by the pixels F6 to F8. In this way, it is possible to acquire an RGB image.

For example, in the actual surgical operation, it is necessary to capture images of a part separated by a fluorescent pigment and the other parts at the same time and present the images to a doctor. Therefore, it is necessary to attach a device capable of capturing both an RGB image and a fluorescent image to the leading end of the endoscope. In addition, it is necessary to reduce the size of the leading end of the endoscope. The use of the above-mentioned technique makes it possible to generate both a fluorescent image with narrow-band sensitivity characteristics and an RGB image while reducing the size of the leading end of the endoscope.

SUMMARY OF THE INVENTION

According to a first aspect of the present invention, an imaging device includes: an R pixel which is made of an organic material and includes a first photodiode, wherein a first color filter that transmits red light is formed on the first photodiode; a G pixel which is made of an organic material and includes a second photodiode, wherein a second color filter that transmits green light is formed on the second photodiode; a B pixel which is made of an organic material and includes a third photodiode, wherein a third color filter that transmits blue light is formed on the third photodiode; and an FPF pixel which includes a fourth photodiode, wherein a Fabry-Perot filter in which an intermediate layer interposed between a first partial reflection layer and a second partial reflection layer is made of a material that transmits light is formed on the fourth photodiode. The R pixel, the G pixel, the B pixel, and the FPF pixel are periodically arranged.

According to a second aspect of the present invention, in the imaging device according to the first aspect, the permittivity of one of a first member forming the first partial reflection layer and a second member forming the second partial reflection layer may be higher than the permittivity of the other member. The intermediate layer may be made of silicon dioxide. Silver may not be used in the first partial reflection layer and the second partial reflection layer.

According to a third aspect of the present invention, in the imaging device according to the first aspect or the second aspect, a first unit pixel in which one R pixel, two G pixels, and one B pixel are arranged in a Bayer pattern and a second unit pixel in which two G pixels and two FPF pixels are alternately arranged may be periodically arranged.

According to a fourth aspect of the present invention, in the imaging device according to any one of the first to third aspects, a plurality of the FPF pixels may be provided, and the intermediate layers of the plurality of FPF pixels may have different thicknesses.

According to a fifth aspect of the present invention, in the imaging device according to any one of the first to fourth aspects, a plurality of the FPF pixels may be provided, and an organic film-stacked pixel that is formed by stacking at least two color filters made of an organic material and includes a photodiode on which a filter with a central transmission band of 600 nm or less is formed may be used instead of some of the plurality of FPF pixels.

DETAILED DESCRIPTION OF THE INVENTION

First Embodiment

Figure 1:
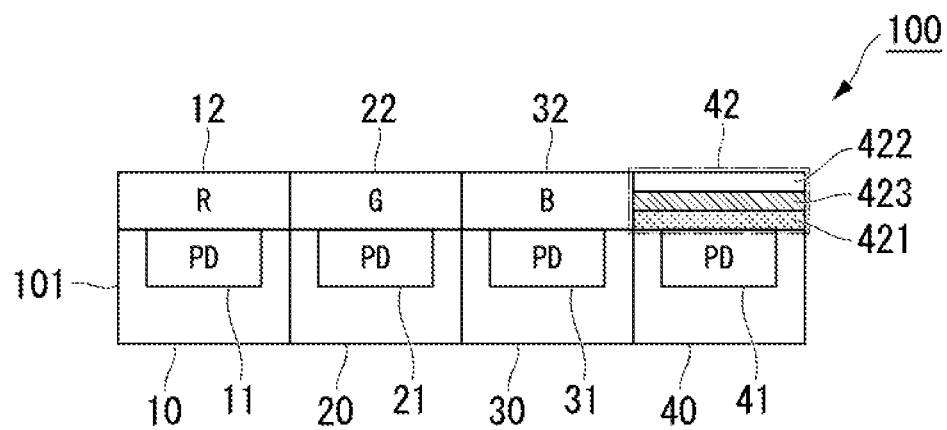
FIG. 1 is a schematic diagram illustrating the structure of pixels of an imaging device according to a first embodiment of the present invention.

Hereinafter, a first embodiment of the present invention will be described with reference to the accompanying drawings. FIG. 1 is a schematic diagram illustrating the structure of pixels in an imaging device according to this embodiment. An imaging device 100 according to this embodiment captures an RGB image and a fluorescent image. The imaging device 100 includes an R pixel 10, a G pixel 20, a B pixel 30, and a FPF pixel 40. The R pixel 10 outputs a signal corresponding to the intensity of incident red light. The G pixel 20 outputs a signal corresponding to the intensity of incident green light. The B pixel 30 outputs a signal corresponding to the intensity of incident blue light. The FPF pixel 40 outputs a signal corresponding to the intensity of incident light with a predetermined wavelength.

In the example shown in FIG. 1, the R pixel 10, the G pixel 20, the B pixel 30, and the FPF pixel 40 are formed on a semiconductor substrate 101 of the imaging device 100. A photodiode (PD; a first photodiode) 11 is formed in the R pixel 10. An organic film color filter (first color filter) 12 which transmits red light is formed on a light-receiving surface of the photodiode 11. Therefore, the R pixel 10 can output a signal corresponding to the intensity of incident red light. A photodiode (PD; a second photodiode) 21 is formed in the G pixel 20. An organic film color filter (second color filter) 22 which transmits green light is formed on a light-receiving surface of the photodiode 21. Therefore, the G pixel 20 can output a signal corresponding to the intensity of incident green light. A photodiode (PD; a third photodiode) 31 is formed in the B pixel 30. An organic film color filter (third color filter) 32 which transmits blue light is formed on a light-receiving surface of the photodiode 31. Therefore, the B pixel 30 can output a signal corresponding to the intensity of incident blue light. The organic film color filters 12, 22, and 32 are made of an organic material.

A photodiode (PD; a fourth photodiode) 41 is formed in the FPF pixel 40. A dielectric layer 421 (first partial reflection layer), a dielectric layer 422 (second partial reflection layer), and an interlayer film 423 (intermediate layer) are formed as a Fabry-Perot filter 42 on a light-receiving surface of the photodiode 41. The interlayer film 423 is interposed between the dielectric layers 421 and 422. The permittivity of one of a member (first member) forming the dielectric layer 421 and a member (second member) forming the dielectric layer 422 is higher than that of the other member. Neither the dielectric layer 421 nor the dielectric layer 422 includes silver. The interlayer film 423 is made of silicon dioxide ($SiO_2$).

The thickness of the interlayer film 423 is determined such that the FPF pixel 40 can output a signal corresponding to the intensity of light with a narrow-band wavelength of interest. For example, when a fluorescent image is acquired in order to specify a cancer cell, the thickness of the interlayer film 423 is determined such that the FPF pixel 40 transmits light of a fluorescent pigment for staining the cancer cell. Therefore, the FPF pixel 40 can output a signal corresponding to the intensity of incident light with the narrow-band wavelength of interest.

For example, a stain solution ICG is a fluorescent pigment with a fluorescence wavelength of 845 nm. Therefore, when ICG is used as the stain solution, the interlayer film 423 is formed such that the FPF pixel 40 outputs a signal corresponding to the intensity of light in a narrow band of wavelengths centered at 845 nm. For example, a stain solution Sirius is a fluorescent pigment with a fluorescence wavelength of 424 nm. Therefore, when Sirius is used as the stain solution, the interlayer film 423 is formed such that the FPF pixel 40 outputs a signal corresponding to the intensity of light in a narrow band of wavelengths centered at 424 nm.

Since a CMOS image sensor or a CCD image sensor is made of silicon, it can output a signal corresponding to light with a wavelength of about 380 nm to 1100 nm. Since the imaging device 100 according to this embodiment is also made of silicon, light with a wavelength in the narrow band of interest which is detected by the FPF pixel 40 can be selected from light components with a wavelength of about 380 nm to 1100 nm.

Figure 2:
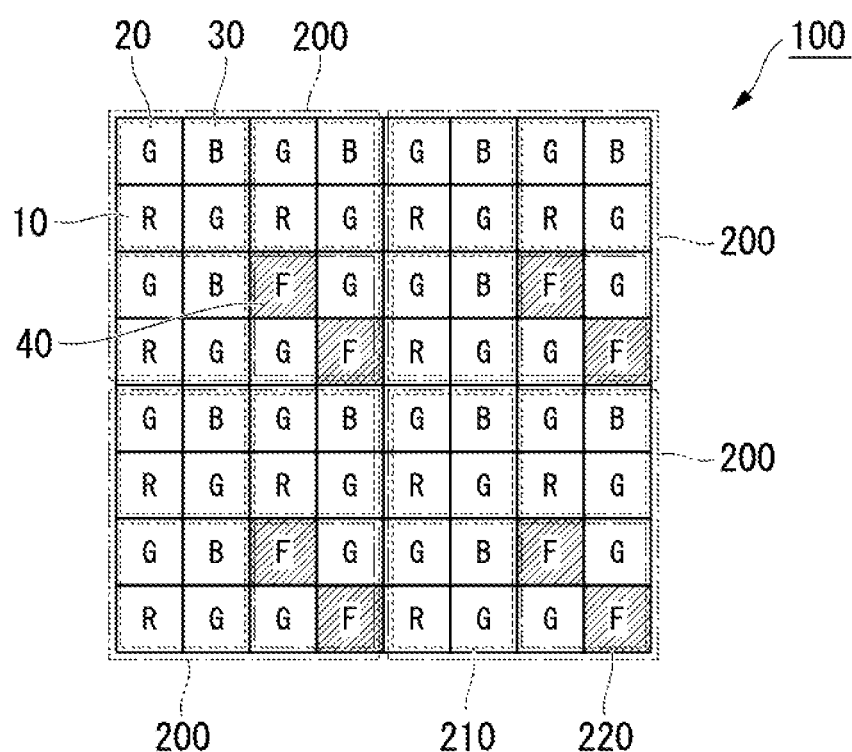
FIG. 2 is a schematic diagram illustrating the arrangement of an R pixel, a G pixel, a B pixel, and an FPF pixel in the first embodiment of the present invention.

Next, the arrangement of the R pixel 10, the G pixel 20, the B pixel 30, and the FPF pixel 40 on the semiconductor substrate 101 of the imaging device 100 will be described. FIG. 2 is a schematic diagram illustrating the arrangement of the R pixel 10, the G pixel 20, the B pixel 30, and the FPF pixel 40 on the semiconductor substrate 101 of the imaging device 100 according to this embodiment. In the example shown in FIG. 2, 4×4 pixels, that is, 16 pixels are arranged as a unit array 200. Specifically, the G pixel 20, the B pixel 30, the G pixel 20, and the B pixel 30 are arranged in the first row of the unit array 200 in this order from the left side of FIG. 2. In addition, the R pixel 10, the G pixel 20, the R pixel 10, and the G pixel 20 are arranged in the second row of the unit array 200 in this order from the left side of FIG. 2. The G pixel 20, the B pixel 30, the FPF pixel 40, and the G pixel 20 are arranged in the third row of the unit array 200 in this order from the left side of FIG. 2. The R pixel 10, the G pixel 20, the G pixel 20, and the FPF pixel 40 are arranged in the fourth row of the unit array 200 in this order from the left side of FIG. 2.

That is, the unit array 200 is formed by periodically arranging a unit pixel 210 in which the R pixel 10, the G pixel 20, and the B pixel 30 are arranged in a Bayer pattern and a unit pixel 220 in which the FPF pixel 40 and the G pixel 20 are alternately arranged. In the example shown in FIG. 2, the unit pixel 210 and the unit pixel 220 are periodically arranged in the proportion of three to one.

It is possible to generate an RGB image using, for example, demosaicing based on the signals output from the R pixel 10, the G pixel 20, and the B pixel 30 which are arranged as shown in FIG. 2. In addition, it is possible to generate a fluorescent image based on the signal output from the FPF pixel 40 which is arranged as shown in FIG. 2. Therefore, for example, in an endoscopic apparatus including the imaging device 100 and an image-generating unit, the image-generating unit can generate an RGB image based on the signals output from the R pixel 10, the G pixel 20, and the B pixel 30 of the imaging device 100 and can generate a fluorescent image based on the signal output from the FPF pixel 40 of the imaging device 100.

As shown in FIG. 2, the number of G pixels 20 is more than the number of R pixels 10 and the number of B pixels 30. This is because the human eye is more sensitive to green light than to red light or blue light. In the example shown in FIG. 2, the number of FPF pixels 40 is less than the number of R pixels 10, the number of G pixels 20, and the number of B pixels 30. The reason is as follows. Since the RGB image is used to accurately acquire the shape and color information of an object, the resolution of the RGB image needs to be high. In addition, since the fluorescent image is used to check the presence of a specific part (for example, a cancer tissue) which is stained by a fluorescent pigment, the resolution of the fluorescent image may be lower than that of the RGB image.

Figure 3:
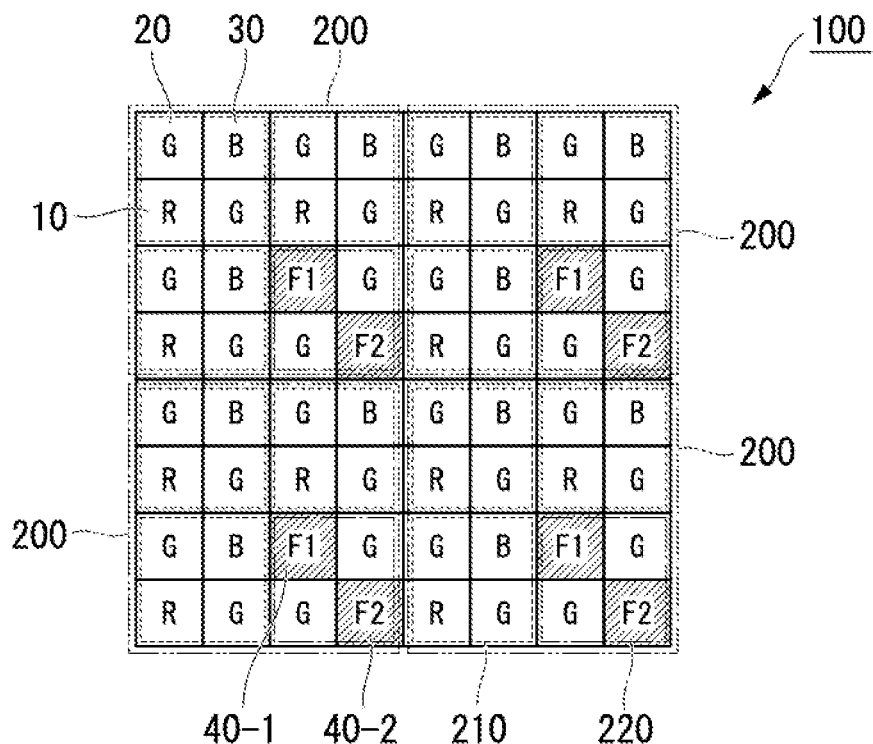
FIG. 3 is a schematic diagram illustrating the arrangement of the R pixel, the G pixel, the B pixel, and plural types of FPF pixels in the first embodiment of the present invention.

In the example shown in FIG. 2, the imaging device 100 includes one type of FPF pixel 40. However, the imaging device 100 may include plural types of FPF pixels 40. FIG. 3 is a schematic diagram illustrating the arrangement of the R pixel 10, the G pixel 20, the B pixel 30, and plural types of FPF pixels 40-1 (F1) and 40-2 (F2) on the semiconductor substrate 101 of the imaging device 100 according to this embodiment. In the example shown in FIG. 3, 4×4 pixels, that is, 16 pixels are arranged as the unit array 200. Specifically, the G pixel 20, the B pixel 30, the G pixel 20, and the B pixel 30 are arranged in the first row of the unit array 200 in this order from the left side of FIG. 3. The R pixel 10, the G pixel 20, the R pixel 10, and the G pixel 20 are arranged in the second row of the unit array 200 in this order from the left side of FIG. 3. The G pixel 20, the B pixel 30, the FPF pixel 40-1, and the G pixel 20 are arranged in the third row of the unit array 200 in this order from the left side of FIG. 3. The R pixel 10, the G pixel 20, the G pixel 20, and the FPF pixel 40-2 are arranged in the fourth row of the unit array 200 in this order from the left side of FIG. 3.

That is, the unit array 200 is formed by periodically arranging a unit pixel 210 in which the R pixel 10, the G pixel 20, and the B pixel 30 are arranged in a Bayer pattern and a unit pixel 220 in which the FPF pixels 40-1 and 40-2 and the G pixels 20 are alternately arranged. In the example shown in FIG. 3, the unit pixel 210 and the unit pixel 220 are periodically arranged in the proportion of three to one. The FPF pixel 40-1 and the FPF pixel 40-2 detect light components in different narrow bands of wavelengths. For example, an interlayer film of the FPF pixel 40-1 and an interlayer film of the FPF pixel 40-2 are formed with different thicknesses such that the FPF pixels 40-1 and 40-2 can detect light components in different narrow hands of wavelengths.

Since the imaging device 100 includes plural types of FPF pixels 40, it is possible to separately acquire the information of auto fluorescence, which is a problem when the characteristics of tissues are analyzed by, for example, a fluorescent pigment, and the information of the fluorescent pigment of interest. For example, after the RGB image and the fluorescent image are generated, the information of autofluorescence and the information of fluorescence are separately provided to the observer, which makes it possible to clearly check the position of the information of fluorescence. In addition, light with a specific wavelength is emitted from the fluorescent pigment by excitation light. When the narrow band detected by one type of FPF pixel 40 among plural types of FPF pixels 40 is set to the wavelength of excitation light, it is possible to acquire the fluorescent image based on the excitation light. Therefore, the observer can check the radiation position of the excitation light and effectively perform observation.

In recent years, there is a pixel which emits fluorescence with multiple wavelengths when excitation light with one wavelength is incident. When plural types of FPF pixels 40 (for example, the interlayer films of a plurality of FPF pixels 40 are formed with different thicknesses) are arranged in the imaging device 100, it is possible to acquire a plurality of fluorescent images or plural kinds of fluorescence information based on light with each wavelength. In addition, since plural kinds of fluorescence information can be obtained, it is possible to acquire the feature information of tissues based on the ratio of fluorescence information items.

Figure 4:
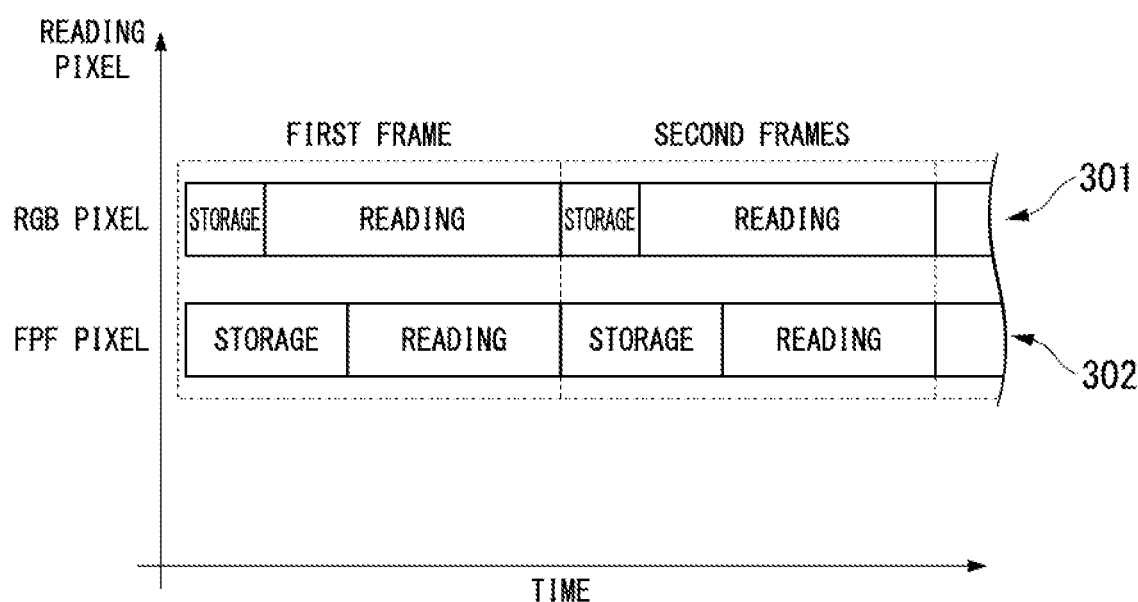
FIG. 4 is a timing chart illustrating the driving time of the imaging device according to the first embodiment of the present invention.

Next, a method of driving the imaging device 100 will be described. FIG. 4 is a timing chart illustrating the driving time of the imaging device 100 according to this embodiment. FIG. 4 shows a timing chart 301 illustrating the driving time of the R pixel 10, the G pixel 20, and the B pixel 30 and a timing chart 302 illustrating the driving time of the FPF pixel 40. In the timing charts, the horizontal axis is time.

As shown in FIG. 4, in this embodiment, the charge storage time (exposure time) of the R pixel 10, the G pixel 20, and the B pixel 30 is longer than the charge storage time (exposure time) of the FPF pixel 40. This is because the band of light detected by the FPF pixel 40 is narrower than that of light detected by the R pixel 10, the G pixel 20, and the B pixel 30 and the sensitivity of the FPF pixel 40 is lower than that of the R pixel 10, the G pixel 20, and the B pixel 30. In this embodiment, a reading time, which is the time required to read a signal from each pixel, is set such that the RGB image and the fluorescent image have the same frame rate.

As described above, according to this embodiment, the imaging device 100 includes the R pixels 10, the G pixels 20, the B pixels 30, and the FPF pixel 40. In addition, in the imaging device 100, the unit pixel 210 in which the R pixels 10, the G pixels 20, and the B pixels 30 are arranged in a Bayer pattern and the unit pixel 220 in which the FPF pixel 40 and the G pixel 20 are alternately arranged are periodically arranged. Therefore, it is possible to generate a fluorescent image with narrow band characteristics and a high-quality RGB image while reducing the size of the imaging device. The imaging device 100 can be manufactured by the same process as that for forming a general CMOS image sensor or a general CCD image sensor. This is because the FPF pixel 40, the R pixel 10, the G pixel 20, and the B pixel 30 can be manufactured by the same standard CMOS process. Therefore, it is possible to avoid the use of a special process or material for forming the FPF pixel 40 and thus reduce costs. For example, a special material, such as silver, may be used to form a Fabry-Perot filter with a narrow band of 600 nm or less. However, in this case, it is necessary to pay attention to contamination in a manufacturing process. The term "contamination in the manufacturing process" means a phenomenon in which heavy metal (for example, silver) used in the manufacturing process is unintentionally diffused into a semiconductor and the characteristics of a semiconductor element deteriorate.

Second Embodiment

Next, a second embodiment of the present invention will be described. An imaging device according to this embodiment differs from the imaging device 100 according to the first embodiment in that it includes an organic film-stacked pixel formed by stacking organic film filters, instead of some FPF pixels 40. The organic film-stacked pixel is formed by stacking at least two organic film filters and a filter with a central transmission band of 600 nm or less is formed on a photodiode of the organic film-stacked pixel. The other structures are the same as those in the first embodiment. The Fabry-Perot filter used in the first embodiment is a narrow band filter using an interference phenomenon. When the filter is implemented by the standard CMOS process, interference does not occur in light with a wavelength of 600 nm or less. Therefore, it is difficult to implement a narrow band filter of 600 nm or less. However, in this embodiment, since organic films with different transmission bands are stacked and combined, it is possible to implement a narrow hand filter even in light with a wavelength of 600 nm or less.

Figure 5:
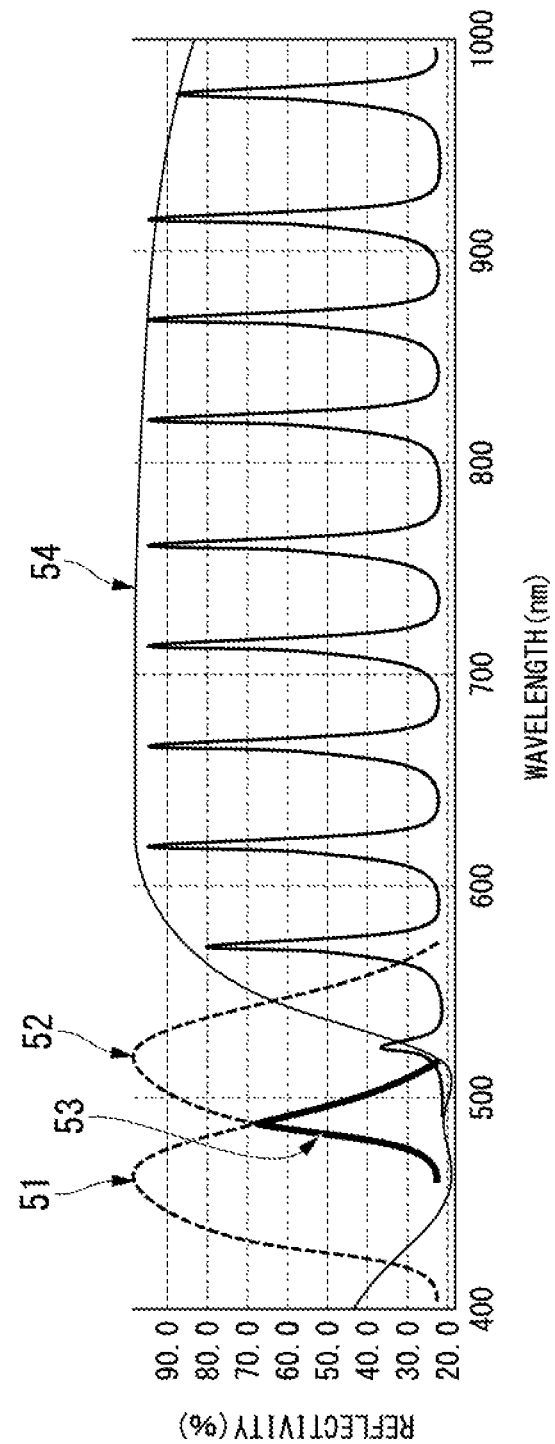
FIG. 5 is a graph illustrating the spectral characteristics of an imaging device according to a second embodiment of the present invention.
Figure 6:
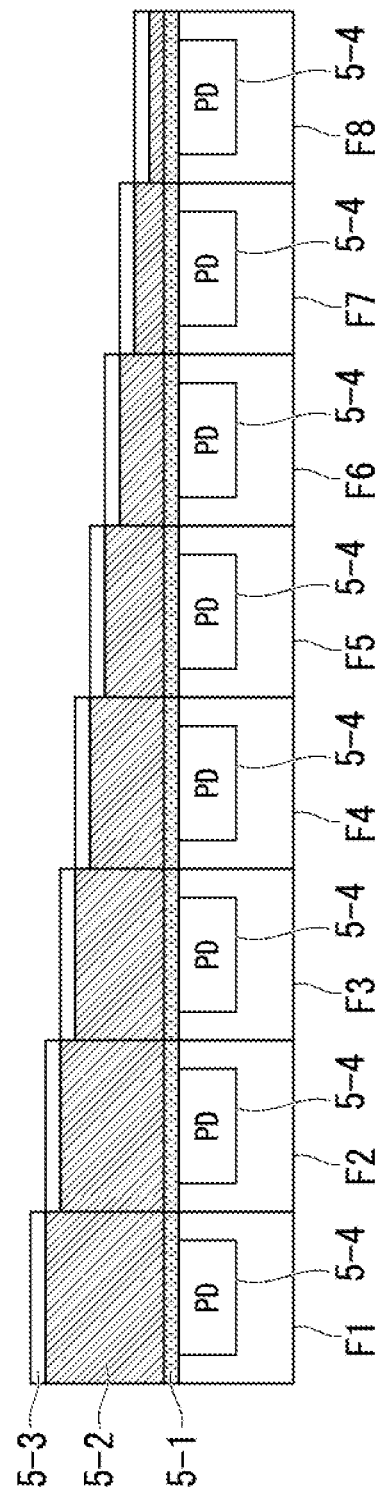
FIG. 6 is a schematic diagram illustrating an example of an FPF pixel in which a Fabry-Perot filter is formed on a pixel of a CMOS image sensor that is known conventionally.
Figure 7:
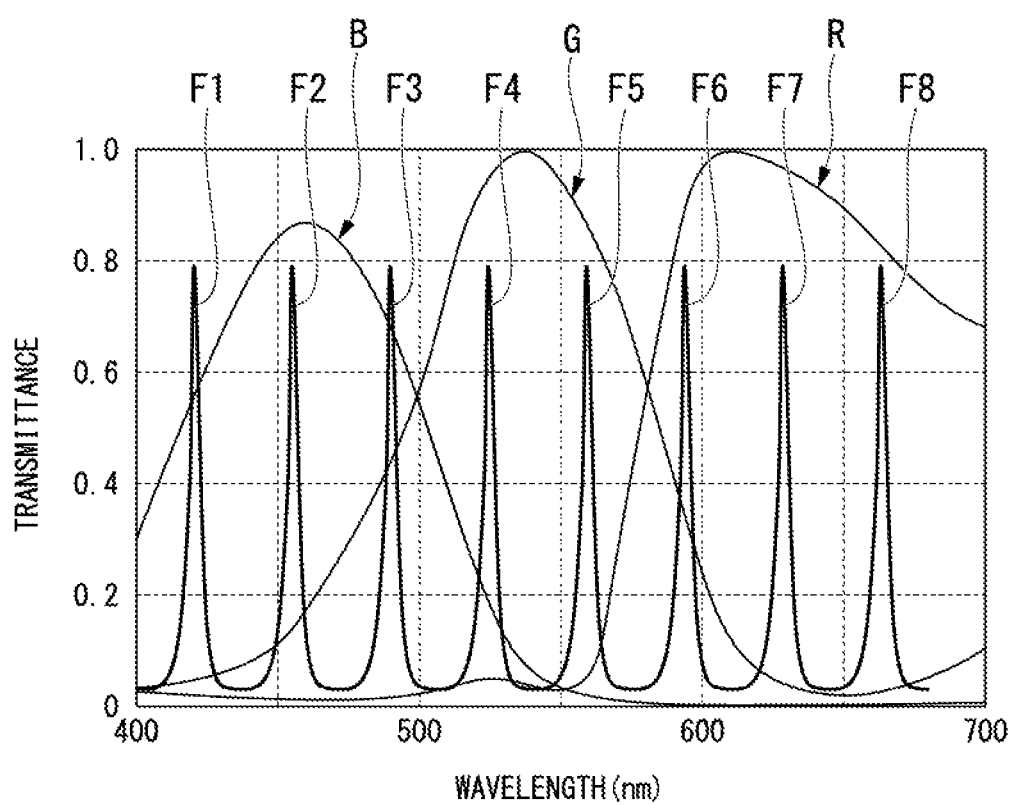
FIG. 7 is a graph illustrating the wavelength of light transmitted through the Fabry-Perot filter that is known conventionally.

A photodiode is formed in the organic film-stacked pixel according to this embodiment. A plurality of organic film filters are formed on a light-receiving surface of the photodiode. The organic film filter formed in the organic film-stacked pixel will be described with reference to FIG. 5. FIG. 5 is a graph illustrating the spectral characteristics of the imaging device according to this embodiment. In the graph shown in FIG. 5, the horizontal axis is a wavelength and the vertical axis is transmittance. A dashed line 51 indicates the relationship between the wavelength and transmittance of light passing through an organic film filter which transmits blue light. A dashed line 52 indicates the relationship between the wavelength and transmittance of light passing through an organic film filter which transmits yellow light. A solid line 53 indicates the wavelength of light incident on an organic film-stacked pixel including the organic film filter which transmits blue light and the organic film filter which is a complementary organic film color filter and transmits yellow light. As shown in FIG. 5, the organic film-stacked pixel can output a signal corresponding to the intensity of incident light with a narrow band wavelength of interest, similarly to the FPF pixel 40. In the example shown in FIG. 5, the organic film-stacked pixel can output a signal corresponding to the intensity of light in a narrow band of wavelengths centered at 480 nm.

It is difficult for the FPF pixel 40 manufactured by the general CMOS manufacturing process to detect light with a narrow band wavelength of 550 nm or less and the transmittance of the FPF pixel 40 at a short wavelength is significantly reduced, as represented by a solid line 54 in FIG. 5. However, in this embodiment, since tire organic film-stacked pixel with the spectral characteristics represented by the solid line 53 in FIG. 5 is used instead of the FPF pixel 40, it is possible to capture a short-wavelength fluorescent image.

In this embodiment, similarly to the first embodiment, it is possible to generate an RGB image using, for example, demosaicing based on the signals output from the R pixel 10, the G pixel 20, and the B pixel 30. In addition, it is possible to generate a fluorescent image based on the signal output from the FPF pixel 40 or the organic film-stacked pixel. Therefore, for example, in an endoscopic apparatus including the imaging device and an image-generating unit according to this embodiment, the image-generating unit can generate an RGB image based on the signals output from the R pixel 10, the G pixel 20, and the B pixel 30 of the imaging device and can generate a fluorescent image based on the signal output from the FPF pixel 40 or the organic film-stacked pixel of the imaging device 100.

While the first and second embodiments of the present invention have been described and illustrated above, it should be understood that these are exemplary of the present invention and are not to be considered as limiting. Additions, omissions, substitutions, and other modifications can be made without departing from the spirit or scope of the present invention. Accordingly, the present invention is not to be considered as being limited by the foregoing description, and is only limited by the scope of the appended claims.

What is claimed is:

1. An imaging device comprising:
    an R pixel which is made of an organic material and includes a first photodiode, wherein a first color filter that transmits red light is formed on the first photodiode;
    a G pixel which is made of an organic material and includes a second photodiode, wherein a second color filter that transmits green light is formed on the second photodiode;
    a B pixel which is made of an organic material and includes a third photodiode, wherein a third color filter that transmits blue light is formed on the third photodiode; and
    an FPF pixel which includes a fourth photodiode, wherein a Fabry-Perot filter in which an intermediate layer interposed between a first partial reflection layer and a second partial reflection layer is made of a material that transmits light is formed on the fourth photodiode,
    wherein the R pixel, the G pixel, the B pixel, and the FPF pixel are periodically arranged.

2. The imaging device according to claim 1,
    wherein a first unit pixel in which one R pixel, two G pixels, and one B pixel are arranged in a Bayer pattern and a second unit pixel in which two G pixels and two FPF pixels are alternately arranged are periodically arranged.

3. The imaging device according to claim 1,
    wherein a plurality of the FPF pixels are provided, and the intermediate layers of the plurality of FPF pixels have different thicknesses.

4. The imaging device according to claim 1,
    wherein a plurality of the FPF pixels are provided, and an organic film-stacked pixel that is formed by stacking at least two color filters made of an organic material and includes a photodiode on which a filter with a central transmission band of 600 nm or less is formed is used instead of part of the plurality of FPF pixels.

5. The imaging device according to claim 1,
    wherein a permittivity of one of a first member forming the first partial reflection layer and a second member forming the second partial reflection layer is higher than a permittivity of the other member,
    the intermediate layer is made of silicon dioxide, and silver is not used in the first partial reflection layer and the second partial reflection layer.

6. The imaging device according to claim 5,
    wherein a first unit pixel in which one R pixel, two G pixels, and one B pixel are arranged in a Bayer pattern and a second unit pixel in which two G pixels and two FPF pixels are alternately arranged are periodically arranged.

* * * * *